United States Patent [19]
Hara

[11] Patent Number: 5,441,843
[45] Date of Patent: Aug. 15, 1995

[54] LIGHT-SENSITIVE MATERIAL CONTAINING SILVER HALIDE, REDUCING AGENT, POLYMERIZABLE COMPOUND AND COLOR IMAGE FORMING SUBSTANCE

[75] Inventor: Hiroshi Hara, Kanagawa, Japan

[73] Assignee: Fuji Photo Film Co., Ltd., Kanagawa, Japan

[21] Appl. No.: 321,889

[22] Filed: Oct. 14, 1994

Related U.S. Application Data

[63] Continuation of Ser. No. 913,007, Jul. 14, 1992, abandoned.

[30] Foreign Application Priority Data

Jul. 15, 1991 [JP] Japan .................................. 3-198245

[51] Int. Cl.⁶ ............................................. G03C 1/72
[52] U.S. Cl. ..................... 430/138; 430/203; 430/218; 430/222; 430/253; 430/281; 430/330
[58] Field of Search ............... 430/138, 203, 218, 253, 430/281, 330, 353, 617, 619, 964, 222

[56] References Cited

U.S. PATENT DOCUMENTS

| | | | |
|---|---|---|---|
| 4,578,339 | 3/1986 | Adkins | 430/138 |
| 4,596,996 | 6/1986 | Sandberg et al. | 346/207 |
| 4,871,641 | 10/1989 | Kakimi | 430/138 |
| 4,891,295 | 1/1990 | Kakimi | 430/138 |
| 4,985,339 | 1/1991 | Koizumi et al. | 430/281 |
| 5,053,308 | 10/1991 | Takeda | 430/281 |

FOREIGN PATENT DOCUMENTS 0203613  12/1986  European Pat. Off. .
0237054   9/1987  European Pat. Off. .

OTHER PUBLICATIONS

Patent Abstracts of Japan vol. 13, No. 146 (P-854) Apr. 11, 1989, & JP-A-63 309 943 (Fuji Photo Film Company) Dec. 19, 1988 *Abstract*.

Primary Examiner—Janis L. Dote
Attorney, Agent, or Firm—Sughrue, Mion, Zinn, Macpeak & Seas

[57] ABSTRACT

A light-sensitive material comprises a support and a light-sensitive layer. The light-sensitive layer contains silver halide, a reducing agent, an ethylenically unsaturated polymerizable compound and a color image forming substance. The silver halide, the reducing agent, the polymerizable compound and the color image forming substance are contained in light-sensitive microcapsules which are dispersed in the light-sensitive layer. According to one embodiment of the present invention, the light-sensitive layer further contains an ethylenically unsaturated polymerizable compound outside the light-sensitive microcapsules. According to another embodiment of the invention, the light-sensitive material further has an auxiliary layer containing an ethylenically unsaturated polymerizable compound. According to the other embodiment of the invention, the light-sensitive material further has an auxiliary layer containing a transfer accelerating compound which has an affinity with the color image forming substance or the ethylenically unsaturated polymerizable compound.

4 Claims, 4 Drawing Sheets

LIGHT-SENSITIVE MATERIAL CONTAINING SILVER HALIDE, REDUCING AGENT, POLYMERIZABLE COMPOUND AND COLOR IMAGE FORMING SUBSTANCE

This is a continuation of application Ser. No. 07/913,007, filed Jul. 14, 1992 (abandoned).

FIELD OF THE INVENTION

The present invention relates to a light-sensitive material containing silver halide, a reducing agent, an ethylenically unsaturated polymerizable compound and a color image forming substance.

BACKGROUND OF THE INVENTION

U.S. Pat. No. 4,629,676 (Hayakawa et al.) and EP-A-0 174 634 disclose a light-sensitive material comprising a support and a light-sensitive layer which contains silver halide, a reducing agent, a polymerizable compound and a color image forming substance. An image-forming method using the light-sensitive material comprises: imagewise exposing to light the material to form a latent image of silver halide; and heating the material to form a polymer image within the area where the latent image has been formed.

U.S. patent application Ser. No. 06/854,640, which was continued as Ser. No. 07/113,346, which was further continued as Ser. No. 07/294,977, which is now allowed and issued as U.S. Pat. No. 5,166,040 (Takeda) and EP-A-0 202 490 disclose another image forming method in which a polymer image is formed within the area where a latent image has not been formed U.S. Pat. No. 4,912,011 (Yamamoto et al.) and EP-A-0 203 613 disclose a light-sensitive material containing light-sensitive microcapsules. Silver halide, a reducing agent, a polymerizable compound and a color image forming substance are contained in the microcapsules which are dispersed in the light-sensitive layer. An image-forming method using the light-sensitive microcapsules comprises: imagewise exposing to light the light-sensitive material; heating the material; and pressing the material on an image receiving material to transfer the color image forming substance with the unpolymerized polymerizable compound. Thus a color image is formed on the image receiving material.

U.S. Pat. No. 4,891,295 (Kakimi) and EP-A-0 237 054 disclose a light-sensitive material containing an organic solvent which is miscible with the polymerizable compound. The organic solvent is contained in microcapsules, which are different from the light-sensitive microcapsules. The organic solvent is a transfer accelerating compound which has a function of reducing the viscosity of the polymerizable compound.

FIG. 1 is a sectional view schematically illustrating the light-sensitive material disclosed in Kakimi and EP-A-0 237 054. As is shown in FIG. 1, the light-sensitive material comprises a support (11) and a light-sensitive layer (12). The light-sensitive layer (12) contains light-sensitive microcapsules (13) and other microcapsules (14). The light-sensitive microcapsules (13) contain silver halide (15), a reducing agent (16), a polymerizable compound (17) and a color image forming substance (18). The other microcapsules (14) contain a solvent (19).

SUMMARY OF THE INVENTION

The light-sensitive material disclosed in Kakimi and EP-A-0 237 054 forms a clear transferred image by the function of the solvent.

The present inventor studied the light-sensitive material disclosed in Kakimi and EP-A-0 237 054. As a result, the inventor has noted that the quality of the transferred image falls short of expectations. According to further study of the inventor, there are two problems in the transferred image.

The first problem is that a color image forming substance is sometimes coagulated in the image. The second problem is that the color of the transferred image is not smooth. A further improvement is necessary to solve at least one of the problems.

An object of the present invention is to provide a light-sensitive material which forms an image having a clear color on an image receiving material.

Another object of the invention is to provide a light-sensitive material which forms a clear transferred image having a smooth color.

The first embodiment of the present invention provides light-sensitive material comprising a support and a light-sensitive layer which contains silver halide, a reducing agent, an ethylenically unsaturated polymerizable compound and a color image forming substance, said silver halide, said reducing agent, said polymerizable compound and said color image forming substance being contained in light-sensitive microcapsules which are dispersed in the light-sensitive layer, wherein the light-sensitive layer further contains an ethylenically unsaturated polymerizable compound outside the light-sensitive microcapsules.

The second embodiment of the invention provides a light-sensitive material comprising a support and a light-sensitive layer which contains silver halide, a reducing agent, an ethylenically unsaturated polymerizable compound and a color image forming substance, said silver halide, said reducing agent, said polymerizable compound and said color image forming substance being contained in light-sensitive microcapsules which are dispersed in the light-sensitive layer, wherein the light-sensitive material further has an auxiliary layer containing an ethylenically unsaturated polymerizable compound.

The third embodiment of the invention provides a light-sensitive material comprising a support and a light-sensitive layer which contains silver halide, a reducing agent, an ethylenically unsaturated polymerizable compound and a color image forming substance, said silver halide, said reducing agent, said polymerizable compound and said color image forming substance being contained in light-sensitive microcapsules which are dispersed in the light-sensitive layer, wherein the light-sensitive material further has an auxiliary layer containing a transfer accelerating compound which has an affinity with the color image forming substance or the ethylenically unsaturated polymerizable compound.

The first problem of the light-sensitive material disclosed in Kakimi and EP-A-0 237 054 is solved by the first and second embodiments of the present invention.

The color image forming substance is usually dissolved or dispersed in the polymerizable compound. The coagulation of the color image forming substance is often caused when the polymerizable compound is diluted with a solvent.

The present inventor surprisingly notes that the polymerizable compound itself can be used as the solvent of the polymerizable compound. When the polymerizable compound itself is used as the solvent, the polymerizable compound cannot be diluted with the solvent. Accordingly the coagulation of the color image forming substance can be much reduced. Therefore, the first and second embodiments of the present invention form an image having a clear color on an image receiving material.

The second problem is solved by the second and third embodiments of the invention.

The light-sensitive material disclosed in Kakimi and EP-A-0 237 054 contains many microcapsules, namely the light-sensitive microcapsules and the other microcapsules containing the solvent. Moreover, all the microcapsules are dispersed in the single light-sensitive layer. The microcapsules have hard resin shells. Therefore, the light-sensitive material has a rough surface. A high pressure is necessary where many microcapsules in a single layer should be ruptured. In this case, the color of the transferred image cannot be smooth.

In the second and third embodiments of the invention, the solvent is separated from the light-sensitive layer. Therefore, the second and third embodiments form a clear transferred image having a smooth color.

DETAILED DESCRIPTION OF THE INVENTION

Figure 1:
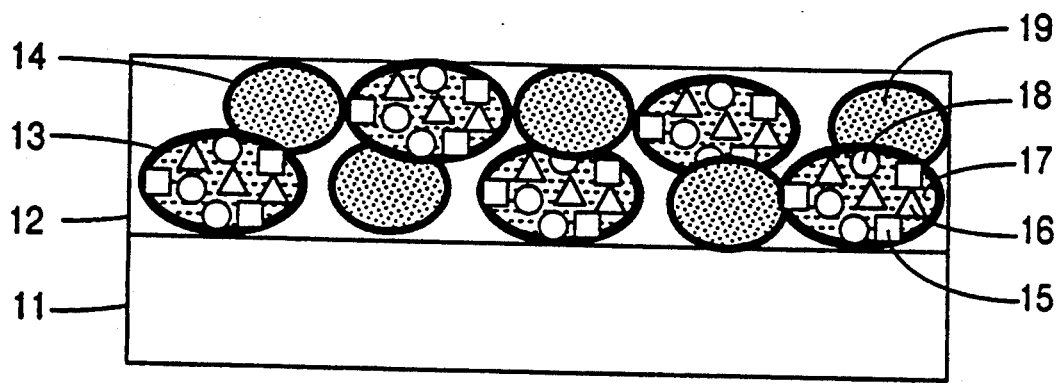
FIG. 1 is a sectional view schematically illustrating the light-sensitive material disclosed in Kakimi and EP-A-0 237 054.

The structure of the light-sensitive material of the present invention is described referring to the drawings.

Figure 2:
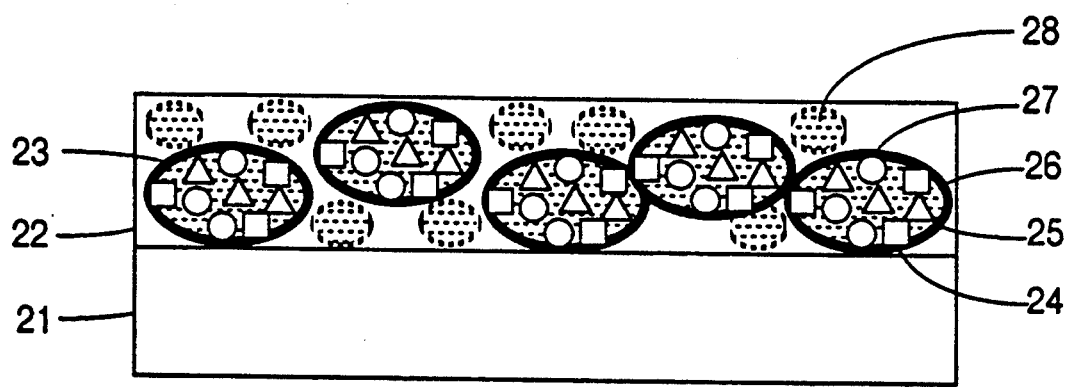
FIG. 2 is a sectional view schematically illustrating the first embodiment (dispersion type) of the light-sensitive material of the present invention.

FIG. 2 is a sectional view schematically illustrating the first embodiment (dispersion type) of the light-sensitive material of the present invention. The light-sensitive material comprises a support (21) and a light-sensitive layer (22). The light-sensitive layer (22) contains light-sensitive microcapsules (23). The light-sensitive microcapsules (23) contain silver halide (24), a reducing agent (25), a polymerizable compound (26) and a color image forming substance (27). The light-sensitive layer (22) further contains a polymerizable compound (28) which is dispersed in the layer.

Figure 3:
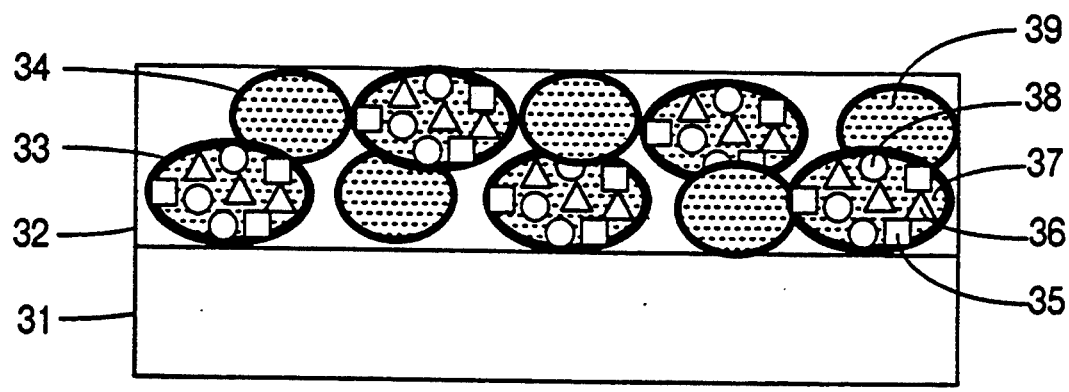
FIG. 3 is a sectional view schematically illustrating the first embodiment (microcapsule type) of the light-sensitive material of the present invention.

FIG. 3 is a sectional view schematically illustrating the first embodiment (microcapsule type) of the light-sensitive material of the present invention. The light-sensitive material comprises a support (31) and a light-sensitive layer (32). The light-sensitive layer (32) contains light-sensitive microcapsules (33) and other microcapsules (34). The light-sensitive microcapsules (33) contain silver halide (35), a reducing agent (36), a polymerizable compound (37) and a color image forming substance (38). The other microcapsules (34) contain a polymerizable compound (39).

Figure 4:
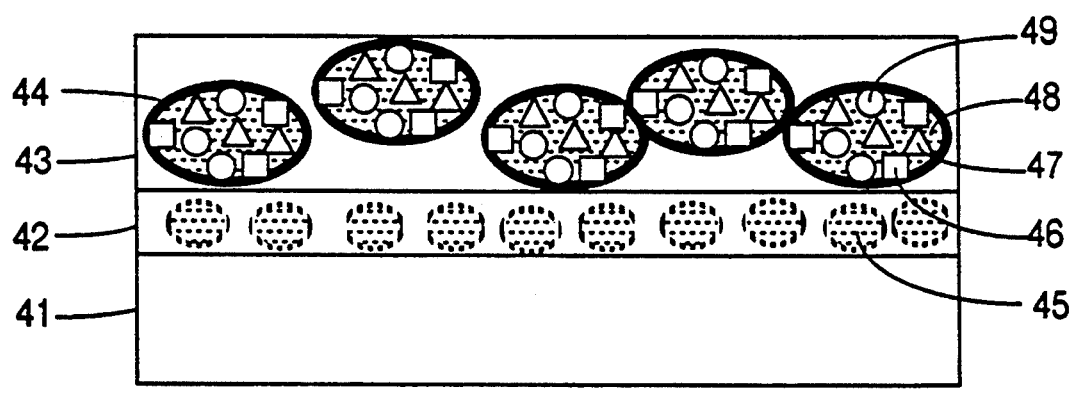
FIG. 4 is a sectional view schematically illustrating the second embodiment (dispersion type) of the light-sensitive material of the present invention.

FIG. 4 is a sectional view schematically illustrating the second embodiment (dispersion type) of the light-sensitive material of the present invention. The light-sensitive material comprises a support (41), an auxiliary layer (42) and a light-sensitive layer (43). The light-sensitive layer (43) contains light-sensitive microcapsules (44). The auxiliary layer (42) contains a polymerizable compound (45) which is dispersed in the layer. The light-sensitive microcapsules (44) contain silver halide (46), a reducing agent (47), a polymerizable compound (48) and a color image forming substance (49).

Figure 5:
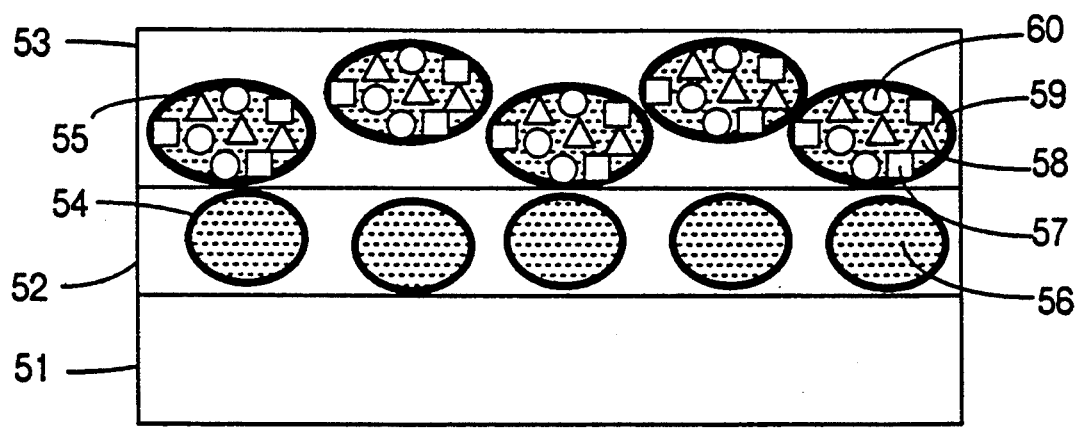
FIG. 5 is a sectional view schematically illustrating the second embodiment (microcapsule type) of the light-sensitive material of the present invention.

FIG. 5 is a sectional view schematically illustrating the second embodiment (microcapsule type) of the light-sensitive material of the present invention. The light-sensitive material comprises a support (51), an auxiliary layer (52) and a light-sensitive layer (53). The auxiliary layer (52) contains microcapsules (54). The light-sensitive layer (53) contains light-sensitive microcapsules (55). The microcapsules (54) in the auxiliary layer contains a polymerizable compound (56). The light-sensitive microcapsules (54) contain silver halide (57), a reducing agent (58), a polymerizable compound (59) and a color image forming substance (60).

Figure 6:
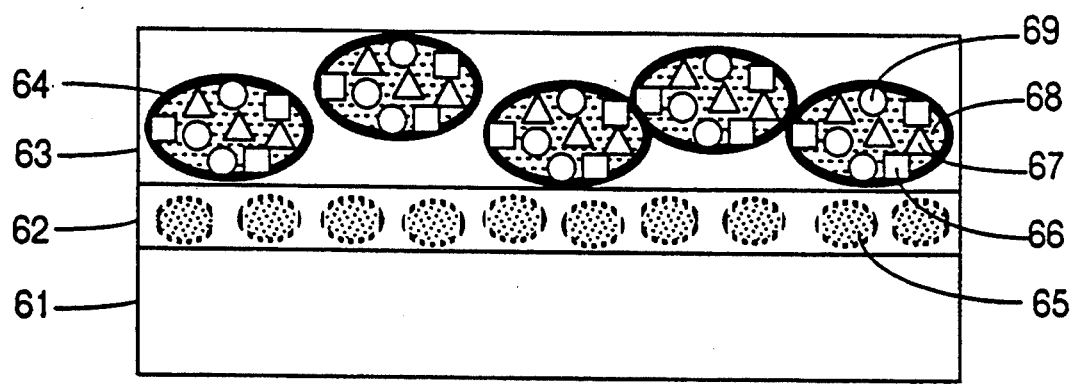
FIG. 6 is a sectional view schematically illustrating the third embodiment (dispersion type) of the light-sensitive material of the present invention.

FIG. 6 is a sectional view schematically illustrating the third embodiment (dispersion type) of the light-sensitive material of the present invention. The light-sensitive material comprises a support (61), an auxiliary layer (62) and a light-sensitive layer (63). The light-sensitive layer (63) contains light-sensitive microcapsules (64). The auxiliary layer (62) contains a transfer accelerating compound (65) which is dispersed in the layer. The light-sensitive microcapsules (64) contain silver halide (66), a reducing agent (67), a polymerizable compound (68) and a color image forming substance (69).

Figure 7:
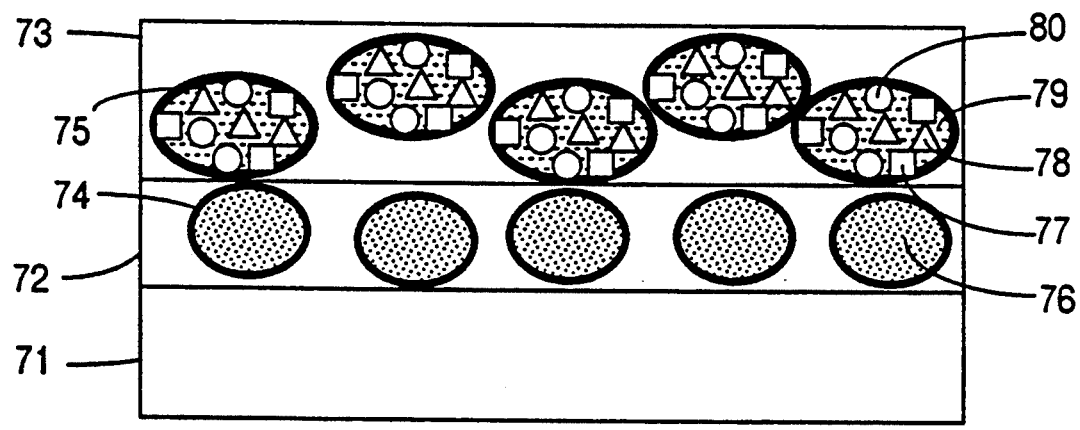
FIG. 7 is a sectional view schematically illustrating the third embodiment (microcapsule type) of the light-sensitive material of the present invention.

FIG. 7 is a sectional view schematically illustrating the third embodiment (microcapsule type) of the light-sensitive material of the present invention. The light-sensitive material comprises a support (71), an auxiliary layer (72) and a light-sensitive layer (73). The auxiliary layer (72) contains microcapsules (74). The light-sensitive layer (73) contains light-sensitive microcapsules (75). The microcapsules (74) in the auxiliary layer contains a transfer accelerating compound (76). The light-sensitive microcapsules (74) contain silver halide (77), a reducing agent (78), a polymerizable compound (79) and a color image forming substance (80).

As is shown in FIGS. 4–7, the light-sensitive material preferably comprises a support, an auxiliary layer and a light-sensitive layer in the order. This order is particularly preferred in the dispersion type shown in FIGS. 4 and 6, since the polymerizable compound or the transfer accelerating compound dispersed in a surface layer sometimes causes tackiness on the surface of the light-sensitive material.

The light-sensitive material of the present invention contains a transfer accelerating compound.

In the first and second embodiments, a polymerizable compound is used as the transfer accelerating compound. Accordingly two polymerizable compounds are arranged inside and outside the light-sensitive microcapsules.

The polymerizable compound used in the present invention is a compound having an ethylenically unsaturated group, namely an ethylenically unsaturated polymerizable compound. Examples of the ethylenically unsaturated polymerizable compounds include acrylic acids, acrylic salts, acrylic esters, acrylamides, methacrylic acids, methacrylic salts, methacrylic esters, methacrylamides, maleic anhydrides, maleic esters, itaconic esters, styrenes, vinyl ethers, vinyl esters, N-vinyl heterocyclic compounds, allyl ethers and allyl esters. Acrylic esters and methacrylic esters are particularly preferred.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyloxyl acrylate, nonylphenyloxyethyl acrylate, 1,3-dioxolan acrylate; hexanediol diacrylate, butanediol diacrylate, neopentylglycol diacrylate, tricyclodecandimethylol diacrylate, diacrylate of polyoxyethylenated bisphenol A, 2-(2-hydroxy-1,1-dimethylethyl)-5-hydroxy-methyl-5-ethyl-1,3-dioxane diacrylate; trimethylolpropane triacrylate, 2-(2-hydroxy-1,1-dimethylethyl)-5,5-dihydroxymethyl-1,3-dioxane triacrylate, triacrylate of propylene oxide addition product of trimethylolpropane; pentaerythritol tetraacrylate, tetraacrylate of propylene oxide 1 to 5 moles addition product of ditrimethylolpropane; dipentaerythritol pentaacrylate; dipentaerythritol hexacrylate, hexaacrylate of caprolactone addition product of dipentaerythritol; polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

The ethylenically unsaturated polymerizable compounds, are described in pages 51-55 of "Published Technical Information No. 5" published by Aztech Co., Mar. 22, 1991.

The two polymerizable compounds used in the first and second embodiments are preferably similar to each other. For example, each of the two polymerizable compounds independently is an acrylic ester or a methacrylic ester. The polymerizable compound used as the transfer accelerating compound most preferably is the same compound as the polymerizable compound contained in the light-sensitive microcapsules.

In the third embodiment, the transfer accelerating compound is different from the polymerizable compound. The transfer accelerating compound in the third embodiment does not have an ethylenically unsaturated group. The transfer accelerating compound has an affinity with the color image forming substance or the ethylenically unsaturated polymerizable compound. The transfer accelerating compound preferably has a boiling point of not lower than 175° C.

The transfer accelerating compound preferably is an ester, an amide or a carboxylic acid. An ester or an amide is more preferred. An ester is most preferred.

Examples of the esters include phthalic esters (e.g., dibutyl phthalate, dioctyl phthalate), phosphoric esters, (e.g., diphenyl phosphate, triphenyl phosphate, triphexyl phosphate, tricyclohexyl phosphate, tricresyl phosphate, trinonyl phosphate, trioctyl phosphate, dioctylbutyl phosphate), citric esters (e.g., tributylacetyl citrate), benzoic esters (e.g., octyl benzoate), trimesic esters (e.g., tributyl trimesate) and esters of the other fatty acids (e.g., dibutoxyethyl succinate, dioctyl azerate). Phosphoric esters are preferred. Examples of the amides are alkylamides (e.g., diethyllaurylamide).

In the dispersion type of the light-sensitive material (shown in FIGS. 2, 4, 6), the polymerizable compound or the transfer accelerating compound is dispersed in the light-sensitive layer or the auxiliary layer, In preparation of the dispersion, a hydrophilic binder and a surface active agent are preferably used. In more detail, the polymerizable compound or the transfer accelerating compound is preferably dispersed or emulsified in a solution or dispersion of the hydrophilic binder using the surface active agent to prepare a coating solution.

The hydrophilic binder preferably is soluble in water, and more preferably is a nonionic or amphoteric water-soluble polymer. Examples of the nonionic water-soluble polymers include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methyl cellulose. An example of the amphoteric water-soluble polymer is gelatin. The water-soluble polymers are described in pages 128-135 of "Published Technical Information No. 5". Two or more water-soluble polymers may be used in combination.

A nonionic surface active agent, an anionic surface active agent, an amphoteric surface active agent, a cationic surface active agent or a fluorine-containing surface active agent is available in preparation of the dispersion of the polymerizable compound or the transfer accelerating compound. A nonionic or anionic surface active agent is preferred. Examples of the nonionic surface active agents are polyethylene glycols. Examples of the anionic surface active agents include alkylbenzene sulfonates (e.g., dodecylbenzene sodium sulfonate) and alkyl sulfonates. The surface active agents are described in pages 136-139 of "Published Technical Information No. 5".

In the microcapsule type of the light-sensitive material (shown in FIGS. 3, 5, 7), the polymerizable compound or the transfer accelerating compound is contained in microcapsules, which are different from the light-sensitive microcapsules. The microcapsules are described in pages 88-89 of "Published Technical Information No. 5".

The shell of the microcapsules is preferably made of a melamine-formaldehyde resin, since the of the melamine-formaldehyde microcapsules forms a tight shell. The shell is more preferably made by forming a film by a reaction of a water-soluble polymer having a sulfinyl group with an ethylenically unsaturated polymerizable compound and forming a resin shell of a polymeric compound (e.g., a melamine-formaldehyde resin) around the film.

In the case where an amino-aldehyde resin is used as the shell of the microcapsules, the amount of residual aldehyde is preferably reduced to a certain trace level.

The average particle size of the microcapsules is preferably in the range of 0.1 to 50 $\mu$m, and more preferably in the range of 3 to 20 $\mu$m. The ratio of the thickness of the microcapsules to the particle size is preferably adjusted in a certain range.

The polymerizable compound or the transfer accelerating compound may contain a reducing agent, an antifogging agent or another additive of the light-sensitive material other than the color image forming substance. The reducing agent is described in pages 18-35 of "Published Technical Information No. 5". The antifogging agent is described in pages 107-123 of "Published Technical Information No. 5". The other additives are also described in "Published Technical Information No. 5".

In the first and second embodiments, the amount of the polymerizable outside of the light-sensitive microcapsules is preferably not less than 5 wt. %, more preferably not less than 15%, and most preferably not less than 30% of the amount of the polymerizable compound contained in the light-sensitive microcapsules. The amount is also preferably not more than 200 wt. % of the amount of the polymerizable compound contained in the light-sensitive microcapsules.

In the third embodiment, the amount of the transfer accelerating compound is preferably not less than 5 wt. %, more preferably not less than 15%, and most preferably not less than 30% of the amount of the polymerizable compound. The amount is also preferably not more than 200 wt. % of the amount of the polymerizable compound.

The other components of the light-sensitive material are described below.

Examples of the silver halide include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron, dodecahedron or tetradecahedron, an irregular form such as spherical form or tabular form, a form having crystalline defect such as a twinning plane, and a mixed form thereof.

The silver halide grains may be extremely small sized grains having a grain diameter of not more than 0.01 μm, or may be relatively large sized grains having a grain diameter of projected area up to 10 μm. The silver halide emulsion may be a polydispersed emulsion or a monodispersed emulsion. The monodispersed emulsion is described in U.S. Patent Nos. 3,574,628 and 3,655,394, and U.K. Patent No. 1,413,748.

A tabular grain having an aspect ratio of not less than approx. 5 can be also employed. The tabular silver halide grains can be prepared by processes described in Gutoff, "Photographic Science and Engineering", Vol. 14, pp. 248-257 (1970), U.S. Pat. Nos. 4,434,226, 4,414,310, 4,433,048 and 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide emulsions can be prepared by processes described, for example, in "Research Disclosure (RD)", No. 17,643, pp. 22-23 (December 1978), (Emulsion preparation and types) and No. 18,716, p. 648.

The silver halide emulsion is generally used after subjecting it to physical ripening, chemical ripening and spectral sensitization. Various additives used in those stages are described in Research Disclosure, No. 17,643 and No. 18,716. The relevant parts in the literature are described below in the form of a table.

Conventional photographic additives used in the invention are also described in the above-mentioned Research Disclosure, and the relevant parts in the literature are also shown in the following table.

| Additives | RD 17,643 | RD 18,716 |
|---|---|---|
| Chemical sensitizing agent | p. 23 | p. 648 (right side) |
| Sensitivity-increasing agent | | p. 648 (right side) |
| Spectral sensitizing agent and Supersensitizing agent | p. 23-24 | p. 648 (right side)-p. 649 (right side) |
| Anti-fogging agent and Stabilizer | p. 24-25 | p. 649 (right side) - |

Details of the silver halide emulsions and the photographic additives are described in pages 2-17 of "Published Technical Information No. 5".

The amount of the silver halide is in the range of 0.001 to 10 g, preferably 0.05 to 2 g, in terms of silver, per 1 $m^2$ of the light-sensitive material. In the invention, an organic silver salt can be used with the silver halide. The organic silver salt is described in pages 17-18 of "Published Technical Information No. 5".

The reducing agent contained in the light-sensitive microcapsules and used in the invention has a function of reducing the silver halide and/or a function of accelerating (or inhibiting) the polymerization of the polymerizable compound. Examples of the reducing agents having the function include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidophenols, 2,4-disulfonamidonaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

The above-mentioned reducing agents are described in pages 18-35 of "Published Technical Information No. 5".

The reducing agent can be used in the light-sensitive material in an amount of wide range, but generally the amount thereof is in the range of 0.1 to 1,500 mole %, preferably in the range of 10 to 300 mole %, based on the amount of the silver salt.

There is no specific limitation on the color image forming substance. Examples of the color image forming substance include colored substance (i.e., dyes and pigments) and non-colored or almost non-colored substance (i.e., color former) which develops to give a color by an external energy (e.g., heating, pressing or light irradiation) or by other components (i.e., color developer).

In the present invention, the color image forming substance preferably is a colored substance showing high stability of the resulting image, such as a dye or a pigment.

As the dye or pigment used in the invention, there can be mentioned not only those commercially available but also those described in various literatures such as "Handbook of Color Index (C. I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The color image forming substances is described in pages 35–50 of "Published Technical Information No. 5". Pigments are particularly preferred because of high fastness to light.

The pigment is preferably used in an amount of 5 to 60 parts by weight based on 100 parts by weight of the polymerizable compound.

The base precursor used in the present invention includes various inorganic or organic compounds (decarboxylation type, thermal decomposition type, reaction type and complex salt-formation type). The base precursor is described in pages 55–86 in "Published Technical Information No. 5".

The base precursor used in the invention preferably releases a base at a temperature in the range of 50° to 200° C., and more preferably in the range of 80° to 180° C.

The base precursor preferably has a solubility in water and the polymerizable compound of not more than 1% at 25° C. to be incorporated into light-sensitive microcapsules. A base precursor composed of a salt of an organic base with a carboxylic acid is particularly preferred.

In the case of incorporating the base precursor into light-sensitive microcapsules, a solid base precursor may be directly dispersed in a polymerizable compound to form a light-sensitive composition. A light-sensitive composition is more preferably prepared by dispersing a base precursor in water and then emulsifying the dispersion in a polymerizable compound.

A nonionic or amphoteric water-soluble polymer is preferably used to disperse the base precursor in water. The nonionic or amphoteric water-soluble polymer is described in pages 128–135 of "Published Technical Information No. 5". The water-soluble polymer is preferably used in an amount of 0.1 to 100 wt. %, more preferably 1 to 50 wt. %, based on the amount of the base precursor.

The base precursor is preferably contained in the dispersion in an amount of 5 to 60 wt. %, more preferably of 10 to 50 wt. %. The base precursor is preferably used in an amount of 2 to 50 wt. %, more preferably 5 to 30 wt. %, based on the amount of the polymerizable compound.

There is no specific limitation on preparation of the light-sensitive microcapsules. Processes for preparation of the light-sensitive microcapsules are described in pages 88–89 of "Published Technical Information No. 5".

The shell of the light-sensitive microcapsules is preferably made of a melamine-formaldehyde resin, since the of the melamine-formaldehyde microcapsules forms a tight shell. The shell is more preferably made by forming a film by a reaction of a water-soluble polymer having a sulfinyl group with an ethylenically unsaturated polymerizable compound and forming a resin shell of a polymeric compound (e.g., a melamine-formaldehyde resin) around the film.

In the case where an amino-aldehyde resin is used as the shell of the microcapsules, the amount of residual aldehyde is preferably reduced to a certain trace level.

The average particle size of the light-sensitive microcapsules is preferably in the range of 1 to 50 μm, and more preferably in the range of 3 to 25 μm. The particle size distribution of the light-sensitive microcapsules preferably is uniform. The ratio of the thickness of the light-sensitive microcapsules to the particle size is preferably adjusted in a certain range.

The average grain size of the silver halide is preferably not more than one fifth of the average particle size of light-sensitive microcapsules, and more preferably is not more than one tenth. A uniform and smooth image can be obtained when the average grain size of the silver halide grains and the average particle size of the microcapsules are adjusted as above.

Silver halide grains are preferably present within the shell of the microcapsule.

In preparation of the light-sensitive microcapsules, the shell of a microcapsule is preferably formed by dispersing an oily liquid of the polymerizable compound containing silver halide, a reducing agent, a color image forming substance and a base precursor in an aqueous medium. The aqueous medium preferably contains a nonionic water-soluble polymer and an anionic water-soluble polymer. The amount of the oily liquid containing the polymerizable compound is preferably in the range of 10 to 120 wt. %, and more preferably 20 to 90 wt. %, based on the amount of the aqueous medium.

Examples of the nonionic water-soluble polymer include polyvinyl alcohol, polyvinyl pyrrolidone, polyacrylamide, polymethylvinyl ether, polyacryloylmorpholine, polyhydroxyethyl acrylate, polyhydroxyethylmethacrylate-co-acrylamide, hydroxyethyl cellulose, hydroxypropyl cellulose and methyl cellulose.

Examples of the anionic water-soluble polymer include polystyrenesulfinic acid, a copolymer of styrenesulfinic acid salt, a salt of polystyrenesulfonic acid, a copolymer of styrenesulfonic acid, a salt of polyvinyl sulfate, a salt of polyvinylsulfonic acid, a maleic anhydride/styrene copolymer, and a maleic anhydride/isobutylene copolymer.

The aqueous medium preferably contains the anionic water-soluble polymer in an amount of 0.01 to 5 wt. %, and more preferably 0.1 to 2 wt. %.

A water-soluble polymer having a few sulfinic groups is preferably used with a nonionic water-soluble polymer.

A hydrophilic compound may be added to the polymerizable compound to reduce the solubility of the base precursor in the polymerizable compound. Examples of the hydrophilic group of the compound include —OH, —$SO_2NH_2$, —$CONH_2$ and —$NHCONH_2$. Examples of the hydrophilic compounds include polyethylene glycol, polypropylene glycol, benzoic acid amide, cyclohexylurea, octyl alcohol, dodecyl alcohol, stearyl alcohol and stearamide.

A conventional antioxidant can be used with the polymerizable compound to prevent oxidative deterioration of the polymerizable compound or to prevent oxidation in the thermal development. Examples of the antioxidants include phenol type antioxidants such as 2,2'-methylene-bis-(4-methyl- 6-t-butylphenol), 2,6-di-t-butylphenol, 2,2'-butylidene-bis-(4-methyl-6-t-butylphenol), 2-t-butyl-6-(3'-t-butyl-5'-methyl-2'-hydroxybenzyl)-4-methylphenylacrylate and 4,4'-thio-bis-(3-methyl-6-t-butylphenol); phosphite type antioxidants such as diphenyldecyl phosphite, triphenyl phosphite, tris-(2,4-di-t-butylphenyl)phosphite and tris-(2-ethylhexyl) phosphite; sulfur type antioxidants such as dilauryl 3,3'-thio-dipropionate, pentaerythritol-tetrakis-($\beta$-lauryl-thio-propionate) and thio-dipropionate; and amine type antioxidants such as phenyl-1-naphthylamine, 6-ethoxy-2,2,4-trimethyl-1,2-dihydroquinoline and dioctyliminodibenzyl.

Examples of the materials used as the support include glasses, ordinary papers, fine paper, baryta paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene). The support is described in pages 144–149 of "Published Technical Information No. 5".

A polymer film is particularly preferred. The thickness of the polymer film support is not more than 50 $\mu$m to keep a heat conductivity, since the light-sensitive material is preferably heated from the side of the support.

An undercoating layer is preferably provided on the polymer film support to form a light-sensitive layer on the support. A metal (e.g., aluminum) film may also be deposited onto the polymer film support.

A polymer film having a thickness of not more than 50 $\mu$m onto which aluminum is deposited is particularly preferred as the support of the light-sensitive material.

Other optional components are described below. Details of these components are described in pages 98–144 and 86–88 of "Published Technical Information No. 5".

A binder can be contained in the light-sensitive layer. Two or more binders may be used in combination. A hydrophilic binder is preferably used. A typical hydrophilic binder is a transparent or semi-transparent polymer. Examples of the hydrophilic binders include natural substances such as gelatin, gelatin derivatives, cellulose derivatives, starch and gum arabic; and synthetic polymer substances such as water-soluble polyvinyl compounds (e.g., polyvinyl alcohol, polyvinyl pyrrolidone and acrylamide polymer). Other example of the synthetic polymer substances is a dispersion-type polyvinyl compound which increases a dimensional stability of photographic materials in the form of latex.

The anti-smudging agent used in the light-sensitive material is preferably in the form of solid particles at room temperature. Concrete examples thereof include starch particles (described in U.K. Patent No. 1,232,347), fine powder of a polymer (described in U.S. Pat. No. 3,625,736), microcapsule not containing a color former (described in U.K. Patent No. 1,235,991), fine powder of cellulose (described in U.S. Pat. No. 2,711,357) and particles of inorganic materials such as talc, kaolin, bentonite, pagodite, zinc oxide, titanium oxide and alumina. A mean particle size of the particles is preferably in the range of 3 to 50 $\mu$m, and more preferably 5 to 40 $\mu$m, in terms of volume mean diameter. The size of the particle is preferably larger than that of the light-sensitive microcapsules.

Various image formation accelerators can be used in the light-sensitive material.

Image formation accelerators have the functions such as (1) accelerating the transfer of a base or a base precursor, (2) accelerating the reaction of a reducing agent and a silver salt, (3) accelerating the inhibiting reaction of coloring substances by polymerization. From a viewpoint of physical chemistry concerning the functions, the image formation accelerators can be classified into base or base precursor, nucleophilic compounds, oils, heat solvents, surface active agents, compounds having interactions with silver or silver salts, compounds having deoxidization function and other compounds. However, these substances generally have complex functions, so each of them usually has several acceleration effects. Details are described in U.S. Pat. No. 4,678,739 (columns 38–40) and Japanese Patent Provisional Publication No. 62(1987)-20944. Also effective are hexavalent metallic compounds described in Japanese Patent Application No. 2(1990)-272873.

In the system wherein the polymerizable compound is polymerized within the area where a latent image of silver halide is not formed, a thermal polymerization initiator or a photopolymerization initiator may be used for initiating the polymerization or polymerizing the unpolymerized polymerizable compound after the image is transferred.

Examples of the thermal polymerization initiator include azo compounds, organic peroxides, inorganic peroxides and sulfinic acids. Details thereof are described in "Addition Polymerization and Ring Opening Polymerization", pp.6–18, edited by the Editorial Committee of High Polymer Experimental Study of the High Polymer Institute, published by Kyoritsu Shuppan (1983).

Examples of the photopolymerization initiator include benzophenones, acetophenones, benzoins and thioxanthones. Details thereof are described in "Ultraviolet Rays Hardening System", pp.63–147, edited by General Technical Center (1989).

Various surface active agents are used for the light-sensitive material for various purposes, such as aiding the coating process, increasing facility of releasability, increasing slipperiness, preventing electrostatic-charging and accelerating development.

An antistatic agent can be used for the light-sensitive material to prevent electrostatic-charging. Antistatic agents are described in Research Disclosure (RD) No. 17643, pp. 27 (November 1978).

A dye or a pigment may be added to the light-sensitive layer of the light-sensitive material to prevent halation or irradiation.

Microcapsules of the light-sensitive material may contain a coloring matter having a property of being decolored by heating or irradiation with light. The coloring matter having a property of being decolored by heating or irradiation with light can play a role corresponding to a yellow filter in the conventional silver salt photographic system. A light-sensitive material may contain such coloring matter having a property of being decolored by heating or irradiation with light.

Various anti-fogging agents and photographic stabilizers are employable for the light-sensitive material of the invention. Examples thereof include azoles and azaindenes described in Research Disclosure No. 17643, pp. 24–25 (1978), nitrogen-containing carbonic acids and phosphoric acids described in Japanese Patent Provisional Publication No. 59(1984)-168442, mercapto compounds and metallic salts thereof described in Japanese Patent Provisional Publication No. 59(1984)-111636 and acetylene compounds described in Japanese Patent Provisional Publication No. 62(1987)-87957.

Various development inhibitors may be used to obtain an image of constant quality independent of the temperature and the time in the developing process.

The development inhibitor is a compound which neutralizes a base or reacts with a base to reduce the base concentration to terminate the development, or a compound which interacts with silver or silver salt to inhibit the development. Examples of the development inhibitors include an acid precursor which releases an acid by heating, an electrophilic compound which substitutes a coexisting chlorine atom by heating, a nitrogen-containing hetero-cyclic compound, a mercapto compound and a precursor thereof.

Examples of layers optionally provided in the light-sensitive material include an image-receiving layer, a heating layer, an antistatic layer, an anticurl layer, a peeling layer, a cover sheet or a protective layer, and an anti-halation layer (a colored layer).

In the image forming method using the light-sensitive material of the invention, an image-receiving material is generally used with the light-sensitive material.

The image-receiving material is described in pages 149–178 of "Published Technical Information No. 5".

The image-receiving material may be composed of a support alone, but preferably an image-receiving layer is provided on the support.

A support of the image-receiving material is not particularly restricted, and materials for the support of a light-sensitive material can be used. Examples of them include glasses, ordinary papers, fine paper, baryta paper, coat paper, cast-coat paper, synthetic papers, cloth, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

In the case where a porous material such as paper is used as a support of the image-receiving material, the surface of the material preferably has a certain smoothness. An image-receiving material may have a transparent support.

The image-receiving layer of the image-receiving material is composed of a white pigment, a binder and other additives, and the white pigment itself or space among the white pigment grains serves to increase receptivity to a polymerizable compound.

Examples of the white pigments employable for the image-receiving layer, with respect to inorganic white pigments, include oxides (e.g., silicon oxide, titanium oxide, zinc oxide, magnesium oxide and aluminum oxide), salts of alkaline earth metals (e.g., magnesium sulfate, barium sulfate, calcium sulfate, magnesium carbonate, barium carbonate, calcium carbonate, calcium silicate, magnesium hydroxide, magnesium phosphate and magnesium hydrogen phosphate), aluminum silicate, aluminum hydroxide, zinc sulfide, various kinds of clay, talc, kaolin, zeolite, acid clay, active clay and glass. Examples of the white pigments, with respect to inorganic white pigments, include polyethylene, polystyrene, benzoguanamine resin, urea-formalin resin, melamine-formalin resin and polyamide resin. These white pigments can be used singly or in combination. The white pigment is desired to have a high oil absorption to the polymerizable compound.

As the binder used for the image-receiving layer, a water-soluble polymer, a polymer latex and a polymer which is soluble in an organic solvent can be mentioned.

Examples of the water-soluble polymers include cellulose derivatives such as carboxymethyl cellulose, hydroxyethyl cellulose and methyl cellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrrolidone, polyacrylic acid, polymethacrylic acid, polyacrylamide, polyvinyl imidazole, polyvinyl pyrazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polymer latex or copolymer latex of acrylic ester and/or methacrylic ester, and ethylene-vinyl acetate copolymer latex.

Examples of the polymer which is soluble in an organic solvent include polyester resin, polyurethane resin, polyvinyl chloride resin and polyacrylonitrile resin.

The binders can be used singly or in combination. Two of the binders can be employed in combination in such amounts as to cause a phase separation in the image-receiving layer.

A mean grain size of the white pigment is within a range of 0.1 to 20 $\mu$m, preferably 0.1 to 10 $\mu$m. The amount of the pigment is in the range of 0.1 to 60 g, preferably 0.5 to 30 g. The weight ratio of the white pigment to the binder preferably is in the range of 0.01 to 0.4, more preferably 0.03 to 0.3.

The image-receiving layer may further contain various components other than the white pigment and the binder.

For example, a color developer can be contained in the image-receiving layer in a color formation system in which a color former is used with the color developer. Typical examples of the color developer include phenols, organic acids or salts thereof, and esters. Zinc salts of salicylic acid derivatives are preferred in the case where a leuco dye is used as a color image forming substance (color former). Of these, zinc salt of 3,5-di-$\alpha$-methylbenzylsalicylic acid is particularly preferred.

The color developer is preferably contained in the image-receiving layer in a coating amount of 0.1 to 50 g/m$^2$, more preferably 0.5 to 20 g/m$^2$.

A thermoplastic compound may be contained in the image-receiving layer. In the case where the thermoplastic compound is contained in the image-receiving layer, the image-receiving layer itself is preferably composed of an agglomerate of fine particles of the thermoplastic compound (i.e., granular thermoplastic compound). The image-receiving layer having this constitution has such advantages that the formation of a transferred image can be readily done and that a glossy image can be obtained under heating after the image formation. There is no specific limitation on the thermoplastic compounds, and any known thermoplastic resins (plastics) and waxes can be employed. The glass transition point of the thermoplastic resin or the melting point of the wax is preferably not higher than 200° C.

A photopolymerization initiator or a thermal polymerization initiator may be contained in the image-receiving layer. Using the image-receiving material, the color image forming substance is transferred onto the image-receiving material together with the unpolymerized polymerizable compound. Therefore, the photopolymerization initiator or the thermal polymerization initiator can be incorporated into the image-receiving layer to cure (fix) the unpolymerized polymerizable compound.

Next, the steps of the image forming method according to the invention are described below. The steps include: imagewise exposing the light-sensitive material; simultaneously or thereafter heating the light-sensitive material from the side of the support (the side on which the light-sensitive layer is not provided); superposing the light-receiving material on the image-receiving material in such a manner that the light-sensitive layer of the light-sensitive material faces the image-receiving material; and applying a pressure thereto.

Various exposure means can be employed in the image-wise exposure, and generally the light-sensitive material is imagewise exposed to a radiation containing visible light to obtain a latent image of the silver halide. The kind of light source or the amount of radiation used in the exposure can be selected depending on a light-sensitive wavelength (or intensified wavelength in the case of spectral sensitization) of the silver halide and a sensitivity of the light-sensitive material.

Examples of the light source, with respect to a light source of a low energy radiation, include natural light, ultraviolet rays, visible light, infrared rays, a fluorescent lamp, a tungsten lamp, a mercury lamp, a halogen lamp, a xenon flash lamp, various lasers (e.g., a gas laser, a solid laser, a chemical laser and a semiconductor laser), a light emission diode, a plasma emitting tube and FOT. High energy radiation such as X-ray, $\gamma$-ray and electron beam is also available in special cases.

In the case where a full color image is formed, the light-sensitive material contains two or more microcapsules which are different from each other with respect to the spectral sensitivity. Therefore, the light-sensitive material is required to be exposed to two or more spectral lights to form a full color image. Accordingly, the light sources may be used singly or in combination.

The light source should be selected in consideration of the light-sensitive wavelength as is mentioned above. Further, it is preferably considered whether the image information is converted into an electrical signal or not (digital or analog). The processing speed of the system, the sizes of the image recording apparatus and the electric power of the apparatus are also important factors in the selection of the light source.

In the case where the image information is not converted into an electrical signal (for example, a case where a subject such as a landscape and a portrait is directly photographed, a case where an original image is directly copied, or a case where a positive film such as a reversal film is exposed to light), exposure devices for a camera, a printer, an enlarging apparatus and a copying machine are available. Using these exposure devices, a two-dimensional image can be exposed to light by one shot. Further, the image can also be scanned through a slit. Moreover, an original image can be enlarged or reduced. In this case, a preferred light source is not a monochromatic light such as a laser but a fluorescent lamp, a tungsten lamp or a combination of plural monochromatic lights.

In the case where the image information is an electrical signal, two or more monochromatic lights such as a light emission diode or a laser can be used in combination as a light source. The combination is determined in consideration of the spectral sensitivity of the heat-developing color light-sensitive material. Further, various known display devices (CRT, liquid crystal display, electroluminescence display, electrochromic display and plasma display) are also available. In this case, the image information is an image signal such as a signal obtained by a video camera or an electron still camera, a television signal (e.g., a signal regulated by Japan Television Signal Standards (NTSC)), a signal consisting of many image elements obtained by scanning an original image, and a signal stored in a recording material such as a magnetic tape or disk.

In the case of the exposure of a color image, two or more monochromatic lights are used in combination in consideration of the spectral sensitivity of the light-sensitive material. In this case, two or more light sources such as LED, a laser and a fluorescent lamp may be used in combination. The light sources may be the same or different. The spectral sensitivity of the light-sensitive material usually contains R (Red), G (Green) and B (Blue). Light sources of UV (Ultraviolet) and IR (Infrared) have also recently been available. In addition to the combination of R, G and B, examples of the combination of the spectral sensitivity include (G, R, IR), (R, short wave IR, long wave IR), (short wave UV, medium wave UV, long wave UV) and (UV, B, G). A combination of different light sources such as two kinds of LED and a laser is available. A light emitting tube or element can be used in a scanning exposure with respect to individual colors. Arrays such as a LED array, a liquid crystal shutter array and a magneto-optical element shutter array can be used to increase the speed of the exposure.

The above-mentioned display devices include a monochromatic device such as CRT and a color device. If a multiple exposure is carried out using some filters, even a monochromatic device can form a color image. Such system is also available. A conventional two-dimensional display device can be used as a one-dimensional device such as FOT. In the case where the display device and a scanner are used in combination, the displayed image can be divided into two or more parts.

In the above-mentioned imagewise exposure process, a latent image is formed in the silver halide contained in the microcapsules.

Simultaneously or after the imagewise exposure process, a heating process to develop the image is carried out in the image forming method in which the light-sensitive material of the invention is used.

The light-sensitive material is preferably heated from the side of the support on which the light-sensitive layer is not provided.

Heating in the heat development process can be conducted in various known manners. For example, a heating layer which is arranged on the light-sensitive material can be used as the heating means. Further, the light-sensitive material can be heated on a hot plate, an iron or a heat roller. Furthermore, the material can be heated between a heat roller and a belt.

The whole surface of the light-sensitive material may be heated by a heater which is larger than the light-sensitive material. The light-sensitive material may also be heated by scanning the material with a small heater (e.g., hot plate, heat roller, heat drum).

Further, the light-sensitive material can be heated without directly contacting the material with a heater. For example, the light-sensitive material may be heated by application of an electromagnetic wave, infrared rays or a hot air.

In the present invention, the light-sensitive material is heated from the side of the support (the side on which the light-sensitive layer is not provided). The side of the light-sensitive layer is usually open to the air. However, the side of the layer may be covered with an adiabatic material to maintain the heating temperature. In this case, it is necessary to handle carefully the adiabatic material. If the adiabatic material is pressed on the light-sensitive material at a high pressure (10 kg/cm$^2$ or more), the microcapsules contained in the light-sensitive layer tend to be ruptured.

Heat development of the light-sensitive material is conducted simultaneously or after the imagewise exposure, but the heat development is preferably carried out at an interval of 0.1 second or more.

The heating temperature usually ranges from 60° C. to 250° C., preferably from 80° C. to 180° C. The heating time is in the range of 0.1 to 10 seconds, preferably 0.1 to 5 seconds.

The light-sensitive material is subjected to the heat development as described above to polymerize the polymerizable compound within the area where a latent image of the silver halide is formed or the area where a latent image of the silver halide is not formed. If a polymerization inhibitor is produced by the reaction with the reducing agent within the area where a latent image of the silver halide is formed, the thermal polymerization initiator or the photopolymerization initiator contained in the microcapsules of the light-sensitive layer may be heated or irradiated with a light to be decomposed, so as to uniformly produce radicals, whereby the polymerizable compound within the area where a latent image of the silver halide is not formed can be polymerized. In this case, heating or exposing the whole surface of the light-sensitive material is necessary in addition to the heat developing process, and a method therefor is similar to that of the imagewise exposure or that of the heat developing process.

A color image can be obtained on an image-receiving material by pressing the light-sensitive material on the image-receiving material to transfer the unpolymerized polymerizable compound to the image-receiving material.

For applying a pressure to the light-sensitive material and the image-receiving material, any known pressing methods can be employed.

For example, the light-sensitive material and the image-receiving material may be sandwiched between press plates such as a presser or they may be transferred using a pressure roller such as nip rolls to apply a pressure to them. A dot-impact device can be also employed to give intermittently a pressure to them.

Otherwise, a pressure may be applied to the light-sensitive material and the image-receiving material by spraying a high-pressure air by means of an air gun or using an ultrasonic wave-generating device or a piezoelectric element.

The light-sensitive material and the image-receiving material are preferably pressed at a pressure of not less than 500 kg/cm$^2$, preferably not less than 800 kg/cm$^2$. However, if those materials are heated at a temperature of 40° to 120° C. in the pressing procedure, a pressure of less than 500 kg/cm$^2$ is enough.

The light-sensitive material of the invention can be used for various purposes such as color photography, printing and copy (e.g., computer-graphic hard copy and xerox copy). The image forming method using the light-sensitive material of the invention can provide a compact and inexpensive image forming system such as a copying machine, a printer and a simple printing machine.

EXAMPLE 1

Preparation of Silver Halide Emulsion (EB-1)

In distilled water was dissolved 24 g of lime-treated inert gelatin at 40° C. over 1 hour. To the resulting solution was added 3 g of NaCl, and then the pH value of the solution was adjusted to 3.2 using 1N-sulfuric acid.

To the obtained gelatin solution, 10 mg of the following compound (AGS-1) was added, and then the following Liquids (I) and (II) were further added simultaneously at the same feed rate at the constant pAg value of 8.5 at 60° C. over 45 minutes by means of a control double jet method. After the addition was complete, the pH value was adjusted to 6.0 using 1N NaOH, and then 6.4 mg of the following compound (AZ-1) and 4.8 mg of the following compound (AZ-2) were added to ripen the mixture at 60° C. for 60 minutes. After the ripening was complete, to the resulting mixture was added 480 mg of the following compound (SB-1), and was further added 100 g of an aqueous solution containing 4.1 g of KI at the same feed rate over 20–30 minutes.

To the resulting emulsion was then added 1.1 g of the following compound (CK-1) to form sediment. After the emulsion was washed with water for desalting, 6 g of lime-treated gelatin was added and dissolved. Then, to the emulsion was further added 1.5 ml of 3.5% aqueous solution of the following compound (ATR-3) to adjust the pH value to 6.2. Thus, a monodispersed tetradecahedral silver iodobromide emulsion (EB-1) was prepared. The yield was 550 g, the mean grain size was 0.24 μm, and the distribution coefficient was 20%.

| Liquid (I): | AgNO$_3$ | 120 g |
|---|---|---|
|  | distilled water | 550 ml |
| Liquid (II): | KBr | 85 g |
|  | distilled water | 550 ml |

Preparation of Silver Halide Emulsion (EG-1)

The procedure of the preparation of Silver halide emulsion (EB-1) was repeated except that Liquids (I) and (II) were added over 15 minutes and that 450 mg of the following compound (SG-1) was added instead of the compound (SB-1).

Thus, a monodispersed silver iodobromide emulsion (EG-1) was prepared. The yield was 550 g, the mean grain size was 0.18 μm, and the distribution coefficient was 22%.

Preparation of Silver Halide Emulsion (ER-1)

The procedure of the preparation of silver halide emulsion (EB-1) was repeated except that Liquids (I) and (II) were added over 15 minutes and that 450 mg of the following compound (SR-1) and 100 mg of the following compound (SR-2) were added instead of the compound (SB-1). Thus, a monodispersed silver iodobromide emulsion (ER-1) was prepared. The yield was 550 g, the mean grain size was 0.18 μm, and the distribution coefficient was 22%.

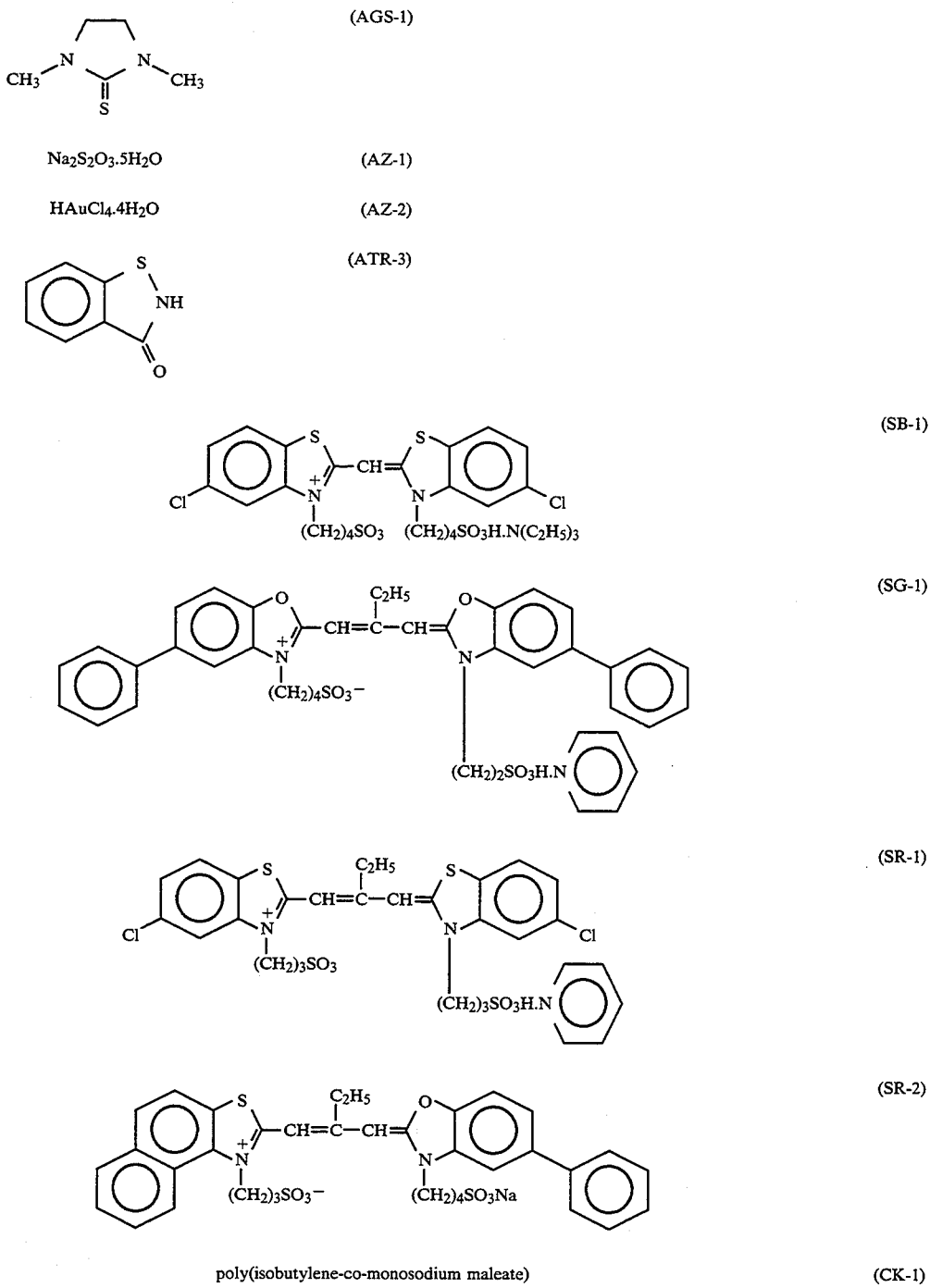

(AGS-1)

$Na_2S_2O_3 \cdot 5H_2O$ (AZ-1)

$HAuCl_4 \cdot 4H_2O$ (AZ-2)

(ATR-3)

(SB-1)

(SG-1)

(SR-1)

(SR-2)

poly(isobutylene-co-monosodium maleate) (CK-1)

Preparation of Solid Dispersion (KB-1)

Into a 300 ml dispersion container were introduced 110 g of a 5.4% aqueous solution of lime-treated gelatin, 20 g of a 5% aqueous solution of polyethylene glycol (average molecular weight: 2,000), 70 g of a base precursor (BG-1) and 200 ml of glass beads having a diameter of 0.5 to 0.75 mm. The resulting mixture was stirred at 3,000 r.p.m. for 30 minutes using a Dynomill, and then the pH value was adjusted to 6.5 using 2N sulfuric acid, to obtain a solid dispersion (KB-1) of a base precursor (BG-1) having a grain size of not more than 1.0 μm.

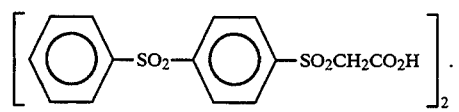

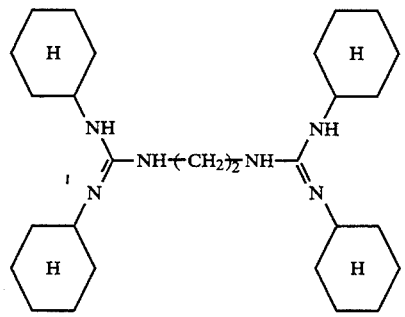

(BG-1)

Preparation of Pigment Dispersion (GY-1)

To 255 g of a polymerizable compound (MN-1) was added 45 g of Chromo Fine Yellow 5900 (tradename, available from Dainichi Seika K.K.). The resulting mixture was stirred at 5,000 r.p.m. for 1 hour using Eiger Motor Mill (tradename, produced by Eiger Engineering) to obtain a pigment dispersion (GY-1).

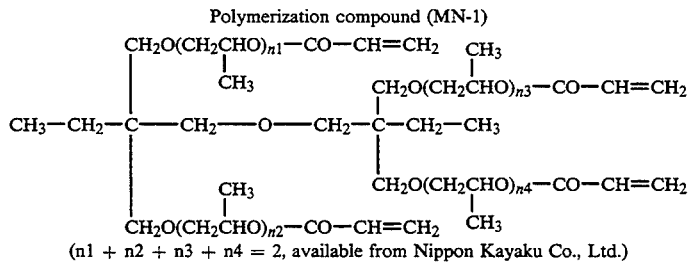

Polymerization compound (MN-1)

(n1 + n2 + n3 + n4 = 2, available from Nippon Kayaku Co., Ltd.)

Preparation of Pigment Dispersion (GM-1)

To 270 g of the polymerizable compound (MN-1) was added 30 g of Rubin F6B (tradename, available from Hechist). The resulting mixture was stirred at 5,000 r.p.m. using Eiger Motor Mill (tradename, produced by Eiger Engineering) for 1 hour to obtain a pigment dispersion (GM-1).

Preparation of Pigment Dispersion (GC-1)

In 255 g of the polymerizable compound (MN-1) were added 45 g of copper phthalocyanine (C.I. Pigment 15), 1.13 g of Solsperse 5000 (tradename of ICI) and 3.37 g of Solsperse 24000 (tradename of ICI). The resulting mixture was stirred at 5,000 r.p.m. using Eiger Motor Mill (tradename, produced by Eiger Engineering) for 1 hour to obtain a pigment dispersion (GC-1).

Preparation of Light-sensitive Composition (PB-1)

In 45 g of the pigment dispersion (GY-1) were dissolved 9 g of a 10 wt. % solution of (1P-4) in (SV-1), 2.3 g of (RD-1), 3.1 g of (RD-3), 2 g of a 0.5 wt. % solution of (FF-3) in (SV-1) and 0.5 g of (ST-1), to prepare an oily solution.

To the resulting oily solution, 7.6 g of the silver halide emulsion (EB-1) and 24 g of the solid dispersion (KB-1) were added, and the resulting mixture was stirred at 10,000 r.p.m. for 5 minutes at 60° C. using a dissolver of 40 φ to obtain a light-sensitive composition (PB-1) in the form of a W/O emulsion.

Preparation of Light-Sensitive Composition

In 45 g of the pigment dispersion (GM-1) were dissolved 9 g of a 10 wt. % solution of (1P-4) in (SV-1), 2.3 g of (RD-1), 3.1 g of (RD-3), 2 g of a 0.5 wt. % solution of (FF-3) in (SV-1) and 0.5 g of (ST-1), to prepare an oily solution.

To the resulting oily solution, 7.6 g of the silver halide emulsion (EG-1) and 24 g of the solid dispersion (KB-1) were added, and the resulting mixture was stirred at 10,000 r.p.m. for 5 minutes at 60° C. using a dissolver of 40 φ to obtain a light-sensitive composition (PG-1) in the form of a W/O emulsion.

Preparation of Light-Sensitive Composition (PR-1)

In 45 g of the pigment dispersion (GC-1) were dissolved 9 g of a 10 wt. % solution of (1P-4) in (SV-1), 2.3 g of (RD-1), 3.1 g of (RD-2), 2 g of a 0.5 wt. % solution of (FF-3) in (SV-1) and 0.5 g of (ST-1), to prepare an oily solution.

To the resulting oily solution, 7.6 g of the silver halide emulsion (ER-1) and 24 g of the solid dispersion (KB-1) were added, and the resulting mixture was stirred at 10,000 r.p.m. for 5 minutes at 50° C. using a dissolver of 40 φ to obtain a light-sensitive composition (PR-1) in the form of a W/O emulsion.

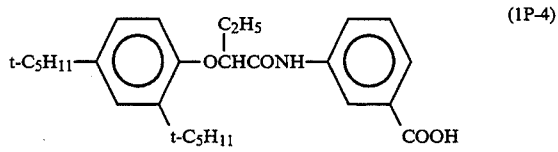

(1P-4)

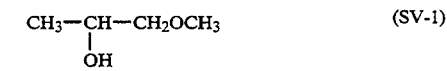

(SV-1)

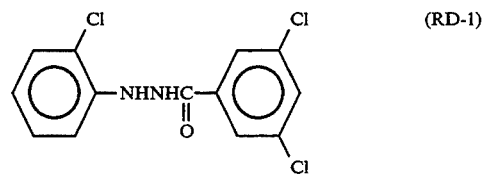

(RD-1)

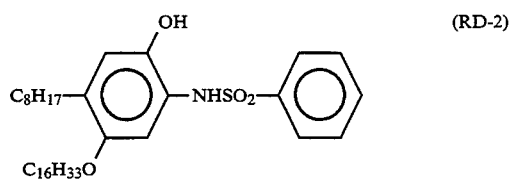

(RD-2)

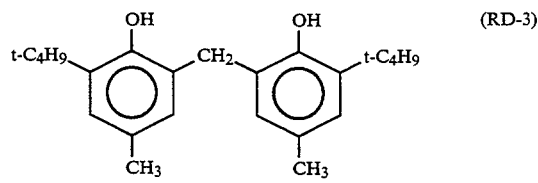

(RD-3)

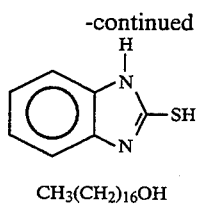 (FF-3)

$CH_3(CH_2)_{16}OH$ (ST-1)

Preparation of Light-Sensitive Microcapsule

To 4 g of a 15% aqueous solution of the following polymer (2P-4) was added 46 g of water, and then the pH value the resulting mixture was adjusted to 5.0 using 2N sulfuric acid. To the mixture was added 50 g of 10% aqueous solution of the following polymer (2P-2), and the obtained mixture was stirred at 60° C. for 30 minutes. Then the above-obtained light-sensitive composition (PB-1) was added to the mixture, and the resulting mixture was stirred at 6,000 r.p.m. for 20 minutes at 60° C. using a dissolver of 40 φ to obtain a W/O/W emulsion.

Independently, to 31.5 g of melamine were added 52.2 g of a 37% aqueous solution of formaldehyde and 170.3 g of water, and the resulting mixture was stirred at 60° C. for 30 minutes to obtain a transparent melamine-formaldehyde precondensate.

To the above-prepared W/O/W emulsion was added 25 g of the above-obtained precondensate having been cooled to 40° C. While the resulting mixture was stirred at 1,200 r.p.m. using a propeller mixer, the pH value was adjusted to 5.0 using 2N sulfuric acid. The mixture was then gradually heated to 70° C. over 30 minutes, and then stirred for 30 minutes. Further, to the mixture was added 10.3 g of a 40% aqueous solution of urea, and the mixture was adjusted to pH 3.5 using 2N sulfuric acid and then stirred at 70° C. for 40 minutes. After the mixture was cooled to 40° C., 9 g of 3% aqueous solution of κ-carrageenan was added to the mixture. The resulting mixture was stirred for 10 minutes and adjusted to pH 6.5 using 2N aqueous solution of sodium hydroxide. Thus, a light-sensitive microcapsule dispersion (CB-1) was prepared.

Preparation of Light-Sensitive Microcapsule (CG-1)

To 4.0 g of a 15% aqueous solution of the following polymer (2P-4) was added 36 g of water, and then the pH value of the resulting mixture was adjusted to 5.0 using 2N sulfuric acid. To the mixture was added 60 g of a 10% aqueous solution of the polymer (2P-2) and the obtained mixture was stirred at 60° C. for 30 minutes. Then the above-obtained light-sensitive composition (PG-1) was added to the mixture, and the resulting mixture was stirred at 6,000 r.p.m. for 20 minutes at 60° C. using a dissolver of 40 φ to obtain a W/O/W emulsion.

Polymer (2P-4)
  Polyvinylbenzene potassium sulfinate-co-acrylamide
Polymer (2P-2)
  Polyvinyl pyrrolidone K-90
Polymer (PC-3)
  PVA KL318 (trade name, available from Kuraray Co., Ltd., carboxy-modified PVA)

To 4 g of a 15% aqueous solution of the polymer (2P-4) was added 46 g of water, and then the pH value the mixture was adjusted to 5.0 using 2N sulfuric acid. To the mixture was added 50 g of a 10% aqueous solution of the polymer (2P-2), and the obtained mixture was stirred at 60° C. for 30 minutes. Then, the above-obtained light-sensitive composition (PR-1) was added to the mixture, and the resulting mixture was stirred at 6,000 r.p.m. for 20 minutes at 60° C. using a dissolver of 40 φ to obtain a W/O/W emulsion.

Independently, to 31.5 g of melamine were added 52.2 g of a 37% aqueous solution of formaldehyde and 170.3 g of water, and the resulting mixture was stirred at 60° C. for 30 minutes to obtain a transparent melamine-formaldehyde precondensate.

To the above-prepared W/O/W emulsion was added 25 g of the above-obtained precondensate having been cooled to 40° C. While the resulting mixture was stirred at 1,200 r.p.m. using a propeller mixer, the pH value was adjusted to 5.0 using 2N sulfuric acid. The mixture was then gradually heated to 70° C. over 30 minutes, and then stirred for 30 minutes. Further, to the mixture was added 10.3 g of a 40% aqueous solution of urea, and the mixture was adjusted to pH 3.5 using 2N sulfuric acid and then stirred at 70° C. for 40 minutes. After the mixture was cooled to 40° C., 9 g of a 3% aqueous solution of κ-carrageenan was added to the mixture. The resulting mixture was stirred for 10 minutes and adjusted to pH 6.5 using 2N aqueous solution of sodium hydroxide. Thus, a light-sensitive microcapsule dispersion (CG-1) was prepared.

Preparation of Light-Sensitive Microcapsule (CR-1)

The procedure of the preparation of (CB-1) was repeated except for using (PR-1) instead of (PB-1), to prepare a light-sensitive microcapsule dispersion (CR-1).

Preparation of Dispersion of Polymerizable Compound (HB-1)

To 50 g of a 10% aqueous solution of the polymer (PC-3) kept at 60° C. were added 15 g of an aqueous solution of dodecylbenzene sulfonic acid soda and 50 g of (MN-1), and the mixture was dispersed at 8,000 r.p.m. using a homogenizer (produced by Nippon Seiki K.K.).

Preparation of transfer Accelerating Compound Dispersion (HB-2)

The procedure of the preparation of the polymerizable compound dispersion (HB-1) was repeated except that trihexyl phosphate was used instead of (MN-1) in the same amount, to prepare a dispersion.

Preparation of Dispersion of Microcapsule (HC-1) Containing Polymerizable Compound To 45 g of (MN-1) were dissolved 9 g of a 10 wt. % solution of (1P-1) in (SV-1), 1.6 g of (RD-1), 1.2 g of (RD-2) and 2 g of a 0.5 wt. % solution of (FF-3) in (SV-1) to prepare an oily solution (YU-1).

To 4.0 g of a 15% aqueous solution of the polymer (2P-4) was added 36 g of water, and then the pH value of the resulting mixture was adjusted to 5.0 using 2N sulfuric acid. To the mixture was added 60 g of a 10% aqueous solution of the polymer (2P-2) and the obtained mixture was stirred at 60° C. for 30 minutes. Then, to the mixture was added the above-obtained oily liquid composition (YU-1), and the resulting mixture was stirred at 6,000 r.p.m. for 20 minutes at 60° C. using a dissolver of 40 φ to obtain an emulsion.

Subsequently, the procedure of the preparation of the light-sensitive microcapsule dispersion (CB-1) was repeated except for using the oily liquid composition (YU-1) instead of the light-sensitive composition (PB-1), to prepare a microcapsule dispersion (HC-1).

Preparation of Dispersion of Microcapsule (HC-2) Containing Transfer Accelerating Compound The procedure of the preparation of the dispersion (HC-1) was repeated except that tricresyl phosphate was used instead of (MN-1) in the same amount, to prepare a microcapsule dispersion (HC-2).

Preparation of light-Sensitive Materials 101–105

Each of 15 g of the light-sensitive microcapsule dispersion (CB-1), 15 g of the light-sensitive microcapsule dispersion (CG-1) and 15 g of the light-sensitive microcapsule dispersion (CR-1) was heated to 40° C. without stirring, and then they were mixed with each other. To the resulting mixture were added 6.5 g of a 5% aqueous solution of the following surface active agent (WW-1), 8 g of a 1% aqueous solution of the following surface active agent (WW-2), 16 g of the polymer (PC-3) and 15 cc of water, and the resulting mixture was stirred at 40° C. for 10 minutes. The mixture was filtered over a filter of 44 μm in mesh, to prepare a capsule coating solution 101.

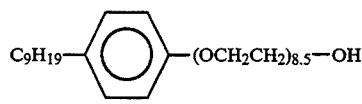
(WW-1)

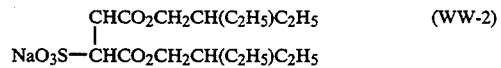
(WW-2)

An aluminum-deposited surface of a support consisting of a polyethylene terephthalate film (thickness: 25 μ) and a layer of aluminum deposited thereon was coated with the above-obtained coating solution in an amount of 100 cc/m$^2$ by an extrusion method, and the coated layer of the solution was dried at 60° C. The dried film was rolled up under the conditions of 25° C. and 65% so that the coated surface might be inside. Thus, a light-sensitive material (101) for comparison was prepared.

The procedure of the preparation of the light-sensitive material (101) was repeated except for adding 15 g of the dispersion (HB-1) instead of the water and decreasing the amount of the 10% solution off the polymer (PC-3) to 10 g to compensate the amount of the polymer (PC-3) contained in the dispersion (HB-1), to obtain a light-sensitive material (102) of the first embodiment (dispersion type).

The procedure of the preparation of the light-sensitive material (102) was repeated except for using the dispersion (HB-2) instead of the dispersion (HB-1) in the same amount, to prepare a light-sensitive material (103) for comparison.

The procedure of the preparation of the light-sensitive material (102) was repeated except for using the dispersion (HC-1) instead of the dispersion (HB-1) in an amount of 30 g so that the coating amount might be 116 cc/m$^2$, to prepare a light-sensitive material (104) of the first embodiment (microcapsule type).

The procedure of the preparation of the light-sensitive material (104) was repeated except for using the dispersion (HC-2) instead of the dispersion (HC-1), to prepare a light-sensitive material (105) for comparison.

Preparation of Image-receiving Material (RS-1)

A mixture of 240 g of calcium carbonate (tradename: PC700, available from Shiraishi Industrial Co., Ltd.), 5.6 g of a surface active agent (Poize 520, available from Kao Co., Ltd.) and 354.4 ml of water was stirred at 8,000 r.p.m. for 3 minutes using a dispersing device (tradename: Ultra Disperser LK-41, Yamato Science Co., Ltd.). To 52 g of the resulting dispersion was added 40 g of a 10% aqueous solution of polyvinyl alcohol (tradename: PVA-117, available from Kuraray Co., Ltd.), and then 4 ml of a 1% aqueous solution of the following surface active agent (WW-3) and 22 ml of water were further added. Thus, a coating solution for an image-receiving layer was prepared.

The coating solution was uniformly applied onto a paper having a basis weight of 80 g/m$^2$ (a paper having such a fiber length distribution defined by JIS-P-8207 that the sum of weight percent of 24 mesh residue and 42 mesh residue is within a range of 30–60%, see: Japanese Patent Provisional Publication No. 63(1988)-186239) in an amount of 65 g/m$^2$, and the coated layer of the solution was dried at 60° C. to prepare an image-receiving material (RS-1).

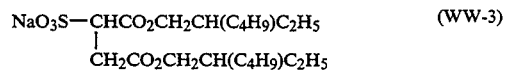
(WW-3)

Image Formation and Evaluation Thereof (Condition A)

Each of the light-sensitive materials was exposed to light at 5,000 lux for 1 second using a halogen lamp kept at a color temperature of 3,100 ° K. through a step wedge filter in which a transmission density of a silver image of black color is changed continuously from 0 to 4.0. Immediately after the exposure, the support side surface of the light-sensitive material (i.e., the side surface where the light-sensitive layer was not provided) was brought into close contact with a drum heated at 150° C. to perform heat development of the light-sensitive material for 1.0 second.

After 30 seconds, the light-sensitive material was superposed on the image-receiving material (RS-1) so that the coated layers of both materials might be in close contact with each other, and they were passed through a press roller (diameter: 3 cm, surface temperature: 25° C.) having a pressure of 1,000 kg/cm$^2$ at a rate of 2 cm/sec, and immediately the light-sensitive material was removed from the image-receiving material.

(Condition B)

The same procedure was repeated as the Condition A except that the light-sensitive material was exposed to light through a magenta filter SP-4 (available from Fuji Photo film Co., Ltd.) provided on the above wedge.

(Condition C)

The same procedure was repeated as the Condition A except that the light-sensitive material and the image-receiving material were passed through a press roller (surface temperature: 65° C.) having a pressure of 200 kg/cm$^2$.

(Condition D)

The same procedure was repeated as the Condition B except that the light-sensitive material and the image-receiving material were passed through a press roller (surface temperature: 65° C.) having a pressure of 200 kg/cm$^2$.

(Condition E)

The same procedure was repeated as the Condition C except that the interval between the heat development and the transfer process was varied to 8 seconds.

(Condition F)

The same procedure was repeated as the Condition D except that the interval between the heat development and the transfer process was varied to 8 seconds.

Each of the light-sensitive materials 101 to 105 was treated under the above-mentioned conditions of Condition A to Condition F. Each of the magenta images formed on the image-receiving materials was measured on the reflection density by means of X-Rite310. The results are set forth in Table 1.

TABLE 1

| Light-sensitive | | Conditions | | | | | |
|---|---|---|---|---|---|---|---|
| Materials | | A | B | C | D | E | F |
| 101 | Dmax | 1.30 | 1.10 | 0.90 | 0.70 | 0.70 | 0.50 |
| (Comparison) | Dmin | 0.07 | 0.07 | 0.06 | 0.06 | 0.07 | 0.07 |
| 102 (D | Dmax | 1.40 | 1.42 | 1.35 | 1.42 | 1.35 | 1.40 |
| type of 1st) | Dmin | 0.08 | 0.08 | 0.07 | 0.07 | 0.07 | 0.07 |
| 103 | Dmax | 1.37 | 1.36 | 1.31 | 1.28 | 1.30 | 1.26 |
| (Comparison) | Dmin | 0.07 | 0.07 | 0.07 | 0.07 | 0.07 | 0.07 |
| 104 (M | Dmax | 1.38 | 1.39 | 1.25 | 1.30 | 1.25 | 1.28 |
| type of 1st) | Dmin | 0.07 | 0.07 | 0.07 | 0.07 | 0.07 | 0.07 |
| 105 | Dmax | 1.35 | 1.15 | 1.20 | 1.10 | 1.15 | 1.05 |
| (Comparison) | Dmin | 0.07 | 0.07 | 0.07 | 0.07 | 0.07 | 0.07 |

As is evident from Table 1, in the case of the light-sensitive material 102 of the invention using a dispersion of a polymerizable compound, an image of high maximum density was obtained even if the pressure was low. Further, a clear monochromatic color was reproduced.

In the case of the light-sensitive material 104 of the invention using microcapsules containing a polymerizable compound, the monochromatic color density was high. When the polymerizable compound was not used as the transfer accelerating compound, the density of the obtained image was improved, but the monochromatic color density was not so improved.

EXAMPLE 2

Preparation of Light-Sensitive Materials 106 and 107

To 20 g of the microcapsule dispersion (HC-1) were added 6.5 g of a 5% aqueous solution of the surface active agent (WW-1), 8 g of a 1% aqueous solution of the surface active agent (WW-2) and 16 g of a 10% aqueous solution of the polymer (PC-3), and they were stirred at 40° C. for 10 minutes to prepare an undercoating liquid 106. An aluminum-deposited surface of a support consisting of a polyethylene terephthalate film (thickness: 25 mm) and a layer of aluminum deposited thereon was coated with the undercoating liquid 106 in an amount of 40 ml/m$^2$ by an extrusion method. On the coated layer was applied the same capsule coating solution 101 as that of the light-sensitive material 101 in the same amount, to prepare a light-sensitive material 106 of the second embodiment (microcapsule type).

The procedure of the preparation of the undercoating liquid 106 was repeated except for adding 10 g of the microcapsule dispersion (HB-2) instead of the microcapsule dispersion (HC-1), varying the amount of the 10% aqueous solution of a polymer (PC-3) to 12g and adding 14 ml of water, to prepare an undercoating liquid 107. A light-sensitive material 107 of the third embodiment (microcapsule type) was prepared in the same manner as described above except for using the undercoating liquid 107 instead of the undercoating liquid 106.

Image Formation and Evaluation Thereof

The light-sensitive materials 106 and 107 were treated under the conditions of Conditions A to F. The results are set forth in Table 2. In Table 2, the results of the light-sensitive material 101 are set forth again for reference.

TABLE 2

| Light-sensitive | | Conditions | | | | | |
|---|---|---|---|---|---|---|---|
| Materials | | A | B | C | D | E | F |
| 101 | Dmax | 1.30 | 1.10 | 0.90 | 0.70 | 0.70 | 0.50 |
| (Comparison) | Dmin | 0.07 | 0.07 | 0.06 | 0.06 | 0.07 | 0.07 |
| 106 (M | Dmax | 1.35 | 1.38 | 1.28 | 1.33 | 1.30 | 1.35 |
| type of 2nd) | Dmin | 0.08 | 0.08 | 0.07 | 0.07 | 0.07 | 0.07 |
| 107 (M | Dmax | 1.37 | 1.38 | 1.30 | 1.30 | 1.31 | 1.32 |
| type of 3rd) | Dmin | 0.07 | 0.07 | 0.07 | 0.07 | 0.07 | 0.07 |

As is evident from Table 2, in the case of using the undercoating layer containing microcapsules of the present invention, the obtained image was high in both the maximum density and the monochromic color density even when the image was transferred at a low pressure.

EXAMPLE 3

Each of the light-sensitive materials 101 to 107 was allowed to stand for 24 hours at 60° C. Then, the surface tackiness was evaluated. The results are set forth in Table 3. The evaluation was carried out by an organoleptic test.

TABLE 3

| | Light-sensitive Materials | | | | | | |
|---|---|---|---|---|---|---|---|
| | 101 | 102 | 103 | 104 | 105 | 106 | 107 |
| Surface Tackiness | None | Present | Present | None | None | None | None |

I claim:

1. A light-sensitive material comprising a support and a light-sensitive layer which contains silver halide, a reducing agent, an ethylenically unsaturated polymerizable compound and a color image forming substance, said silver halide, said reducing agent, said polymerizable compound and said color image forming substance being contained in light-sensitive microcapsules which are dispersed in the light-sensitive layer, wherein the light-sensitive layer further contains an ethylenically unsaturated polymerizable compound outside the light-sensitive microcapsules, said polymerizable compound outside the light-sensitive microcapsules being dispersed in the light-sensitive layer without use of microcapsules.

2. The light-sensitive material as claimed in claim 1, wherein the amount of the polymerizable compound outside the light-sensitive microcapsules is not less than 5 wt. % of the amount of the polymerizable compound contained in the light-sensitive microcapsules.

3. The light-sensitive material as claimed in claim 1, wherein each of the two polymerizable compounds independently is an acrylic ester or a methacrylic ester.

4. The light-sensitive material as claimed in claim 1, wherein the polymerizable compound outside the light-sensitive microcapsules is the same compound as the polymerizable compound contained in the light-sensitive microcapsules.

* * * * *